(12) United States Patent
Miyajima et al.

(10) Patent No.: US 7,567,598 B2
(45) Date of Patent: Jul. 28, 2009

(54) SEMICONDUCTOR LASER EQUIPMENT

(75) Inventors: Hirofumi Miyajima, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/593,033

(22) PCT Filed: Mar. 8, 2005

(86) PCT No.: PCT/JP2005/003979

§ 371 (c)(1),
(2), (4) Date: May 8, 2008

(87) PCT Pub. No.: WO2005/088788

PCT Pub. Date: Sep. 22, 2005

(65) Prior Publication Data

US 2008/0247432 A1  Oct. 9, 2008

(30) Foreign Application Priority Data

Mar. 17, 2004  (JP) .......................... P2004-076942

(51) Int. Cl.
*H01S 3/04* (2006.01)
(52) U.S. Cl. .............................. 372/35; 372/34; 372/36
(58) Field of Classification Search .................. 372/34, 372/35, 36
See application file for complete search history.

(56) References Cited

FOREIGN PATENT DOCUMENTS

| JP | 57-141986 | 9/1982 |
|---|---|---|
| JP | 05-090463 | 4/1993 |
| JP | 06-037219 | 2/1994 |
| JP | 8-139478 | 5/1996 |
| JP | 8-139479 | 5/1996 |
| JP | 9-194204 | 7/1997 |
| JP | 10-209531 | 8/1998 |
| JP | 2000-307284 | 11/2000 |
| JP | 2003-008273 | 1/2003 |
| WO | WO 00/11717 | 3/2000 |
| WO | WO 00/11922 | 3/2000 |

*Primary Examiner*—Armando Rodriguez
(74) *Attorney, Agent, or Firm*—Drinker Biddle & Reath LLP

(57) ABSTRACT

This invention relates to a semiconductor laser apparatus having a structure to prevent corrosion in a refrigerant flow path of a heat sink and cool stably a semiconductor laser array over a long period. The semiconductor laser apparatus has a semiconductor laser stack, a refrigerant supplier, an insulating piping, and a refrigerant. The refrigerant supplier supplies the refrigerant to the semiconductor laser stack. The refrigerant is comprised of fluorocarbon. The insulating piping is an insulating piping with flexibility. An grounded conductive material is arranged inside the insulating piping. The conductive material operates to remove static electricity generated where the refrigerant flows inside the insulating piping.

6 Claims, 10 Drawing Sheets

Fig.2
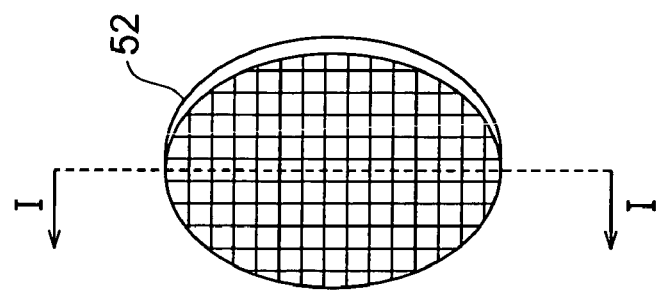
(c)
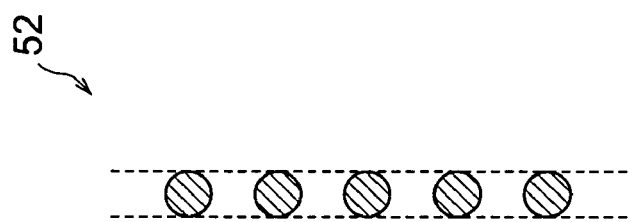
(b)
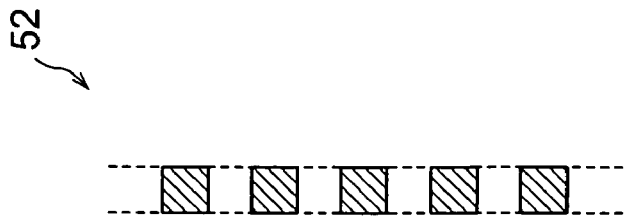
(a)

Fig.6
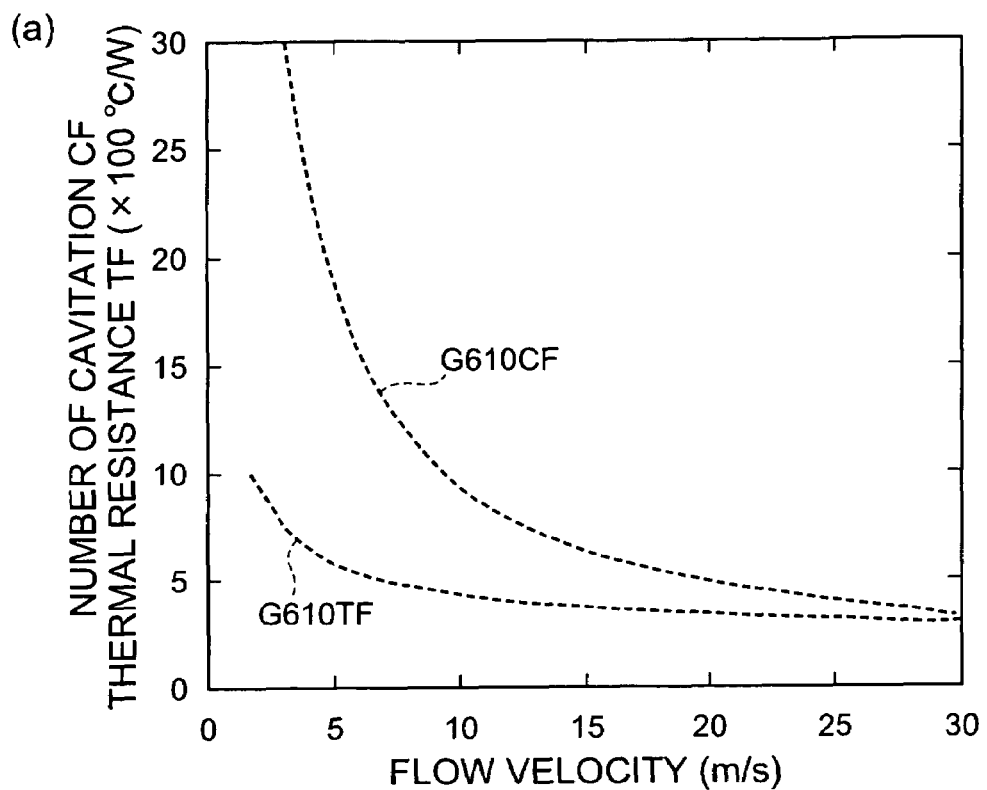
(a)
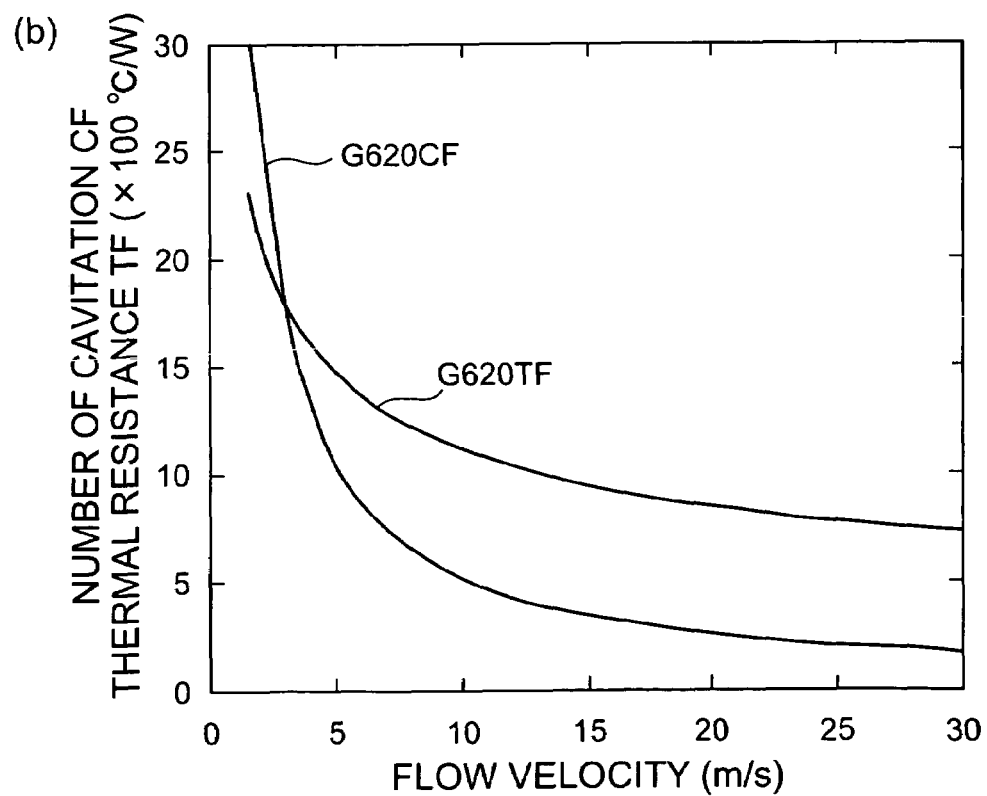
(b)

SEMICONDUCTOR LASER EQUIPMENT

TECHNICAL FIELD

The present invention relates to a semiconductor laser apparatus having a semiconductor laser array as an emission source, and having a structure for cooling the semiconductor laser array efficiently.

BACKGROUND ART

In recent years, a semiconductor laser apparatus enabling several watts to one hundred watts is developed. Such a semiconductor laser apparatus is also used as a laser trimmer, laser soldering iron, and a laser marker.

Since the electro-optical conversion efficiency of the semiconductor laser apparatus is approximately 50%, half of power to be introduced can be transferred to heat. Because of this heat, the laser output, efficiency, and life of the element is greatly affected. In order to cool efficiently such heat, a heat sink employing water having high heat conductivity and large heat capacity as a refrigerant is used. For such a heat sink, for example, the following one is known: a fine flow path is formed by combining a plurality of plate-shaped members made of copper, and cooling water is circulated in the flow path. The cooling water cools the semiconductor laser array by carrying out heat exchange with the semiconductor laser array mounted on the upper portion of the flow path (for example, see Patent References 1 and 2).

The aforementioned semiconductor laser apparatus has a stack structure in which a plurality of semiconductor laser arrays are stacked. When a high power output is intended, a plurality of heat sinks each are inserted between the stacked semiconductor laser arrays. These heat sinks not only carry out cooing to the semiconductor laser array, but also fills the role of an electrically conductive path; thus, an electric field is also applied to the heat sink in operation of each semiconductor laser array (for example, see FIG. 1 of Patent Reference 1).
Patent Reference 1: International Publication No. 00/117117 Pamphlet
Patent Reference 2: JP-A-10-209531

DISCLOSURE OF THE INVENTION

Problem to be Solved by the Invention

The inventors have studied conventional semiconductor laser apparatuses in detail, and as a result, have found problems as follows. That is, in the conventional semiconductor laser apparatus having a heat sink using water as a refrigerant, the corrosion of a flow path pointed out below is not prevented sufficiently, and a semiconductor laser array to be cooled over a long period cannot be cooled efficiently and stably.

Thus, in the aforementioned semiconductor laser stack apparatus, the heat sink constitutes part of an electric circuit, since a current flows in the heat sink itself, the current also flows in the water flowing in the heat sink. Though an ion exchange water suppressing the conductance is employed for a cooling water, the ion exchange water also has a resistance value of approximately 1 MΩ; thus, a current of approximately 1 µA by applied voltage of approximately 1 V flows, so that an electrodialysis of water having the heat sink as an electrode can occur in the flow path. In such a case, corrosion can electrochemically occur on the inner wall of the flow path. When such corrosion proceeds, a possibility of occurrences such as clogging in the flow path, leakage of water, short-circuit due to leakage of current is increased.

In order to overcome the above-mentioned problems, it is an object of the present invention to provide a semiconductor laser apparatus having a structure to prevent the corrosion caused in a refrigerant flow path within a heat sink and cool a semiconductor laser array over a long period.

Means for Solving Problem

A semiconductor laser apparatus according to the present invention comprises a semiconductor laser array, a heat sink on which the semiconductor laser array is mounted, a refrigerant containing fluorocarbon and flowing in the heat sink, a refrigerant supplier for supplying the refrigerant, an insulating piping connected between the heat sink and the refrigerant supplier and flowing the refrigerant inside the piping, and a conductive material arranged inside the insulating piping while being grounded.

As described above, the fluorocarbon having a by far lower reactivity and conductivity than water is applied as the refrigerant, thereby preventing corrosion in the flow path of the refrigerant. Also, the grounded conductive material is arranged within the insulating piping, thereby enabling to discharge the static electricity to be generated in an event where the fluorocarbon is flowed therein.

In the semiconductor laser apparatus according to the present invention, it is preferable that the conductive material has a mesh structure covering the cross-section of the flow path within the insulating piping. When the conductive material has the mesh structure, the contact area with the refrigerant flowing in the insulating piping is enlarged, which can enhance an advantageous effect to discharge the generated static electricity.

In addition, it is preferable that the cross-section of the conductive material in parallel to the streamline of the refrigerant includes a streamline portion. In this case, since the resistance of the conductive material with respect to the refrigerant can be reduced, the change of the flow velocity of the refrigerant that flows in the insulating piping can be avoided. Also, a phenomenon that a vortex occurs in the later stream of the conductive material to cause a micro-bubble nucleus can be avoided. As a result, the occurrence of cavitations can be prevented more effectively.

In the semiconductor laser apparatus according to the present invention, it is preferable that the insulating piping includes an expanded diameter portion having a locally expanded inner diameter, and that the conductive material is arranged at the expanded diameter portion. With this construction, the flow velocity in a portion arranged by the conductive material and having an accelerated flow velocity of the refrigerant can be lowered by expanding the inner diameter of the piping; thus, the occurrence of cavitations can be prevented still more effectively.

In the semiconductor laser apparatus according to the present invention, both the semiconductor laser array and the heat sink have a plate shape, and the semiconductor laser unit is constructed by the semiconductor laser array and heat sink.

Therefore, the semiconductor laser apparatus according to the present invention may have a plurality of semiconductor laser units each having the same structure as that in the semiconductor laser apparatus according to claim 5. In this case, a semiconductor laser stack is configured as follows: the plurality of semiconductor laser units are stacked such that the semiconductor laser units and heat sinks are alternately arranged to each other.

In the semiconductor laser apparatus according to the present invention, since the semiconductor laser array can be cooled stably, a more advantageous effect may be exhibited when the above-mentioned semiconductor laser stack is applied.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

Effect of the Invention

In accordance with the semiconductor laser apparatus according to the present invention, the corrosion of the refrigerant flow path of the heat sink can be prevented, and the semiconductor laser array can be stably cooled over a long period. Also, a stable laser output can be obtained. Further, there is prepared a structure capable of discharging the static electricity generated when the fluorocarbon passes through the insulating piping; thus, a static electricity spark and so on due to the static electricity can be avoided effectively.

BRIEF DESCRIPTION OF THE DRAWINGS

FIG. 2 is a view showing a structure of a conductive material in the semiconductor laser apparatus (FIG. 1) according to a first embodiment;

FIG. 6 is graphs showing together the relationships shown in FIGS. 4 and 5 for each of the water and fluorocarbon;

Figure 1:
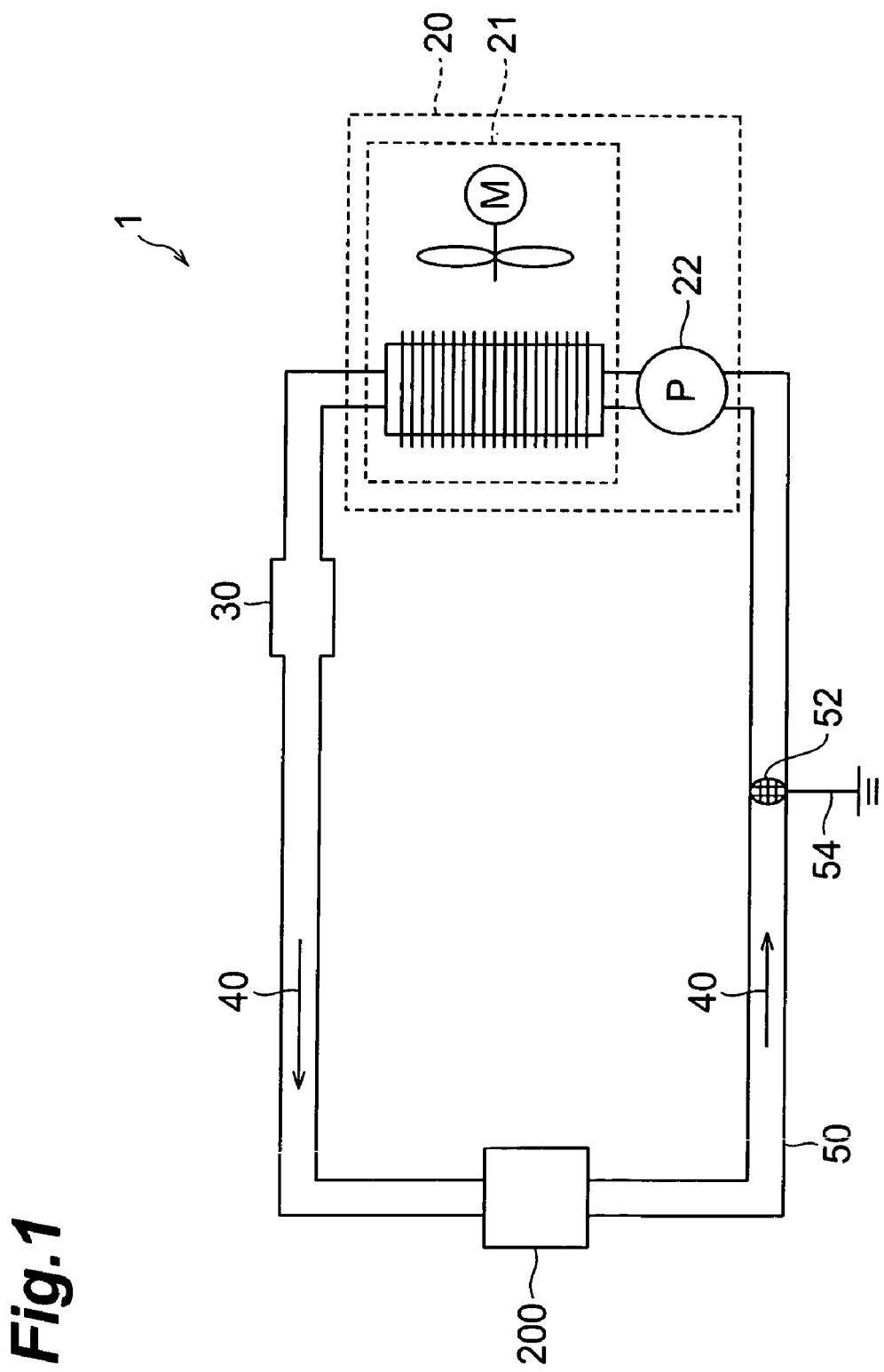
FIG. 1 is a diagram showing a construction of a first embodiment of a semiconductor laser apparatus according to the present invention.

Description of the Reference Numerals 1, 1' . . . semiconductor laser apparatus; 2a, 2b, 2c . . . semiconductor laser array; 10a, 10b, 10c . . . heat sink; 20 . . . chiller (refrigerant supplier); 40 . . . refrigerant; 50 . . . insulating piping; 52, 52' . . . conductive material; 54 . . . grounding wire; 56 . . . expanded diameter portion; 100a, 100b, 100c . . . semiconductor laser unit; and 200 . . . semiconductor laser stack.

BEST MODES FOR CARRYING OUT THE INVENTION

In the following, embodiments of a semiconductor laser apparatus according to the present invention will be explained in detail with reference to FIGS. 1 to 10. In the explanation of the drawings, constituents identical to each other will be referred to with numerals identical to each other without repeating their overlapping descriptions.

FIG. 1 is a diagram showing a construction of a first embodiment of a semiconductor laser apparatus according to the present invention. As shown in FIG. 1, a semiconductor laser apparatus 1 according to the first embodiment composes a semiconductor laser stack 200, a chiller (refrigerant supplier) 20, an insulating piping 50 connecting therebetween, and a refrigerant 40 flowing therein.

The chiller 20 composes an air-cooling unit 21 and a circulating pump 22. The air-cooling unit 21 cools the refrigerant, and the circulating pump 22 supplies the refrigerant 40 to a semiconductor laser stack 200 through the insulating piping 50.

The refrigerant 40 contains fluorocarbon. The fluorocarbon is a compound in which part or all of hydrogen atoms of a hydrocarbon are replaced with fluorine atoms. Since the atomic radius of the fluorine atom is greater as compared with that of the hydrogen atom, the atom skeleton of the carbon is like to be covered with the fluorine atoms because of the replacement of the fluorine atoms. The fluorine atom has a large electro-negativity, and its electron cloud is localized on the side of the fluorine atom. For this reason, the electron concentration of the section of the carbon skeleton is lowered, and then the reactivity may be greatly lowered. As a result, the fluorocarbon has a high chemical stability not to react to most of matters. Also, since the fluorocarbon has an electrical resistivity of $10^{13}$ $\Omega \cdot m$, which is by far higher than $10^7$ $\Omega \cdot m$ of water, electrodialysis due to current-carrying occurs hard which is different from water. More preferably, the refrigerant is per fluorocarbon, that is, a compound in which all the hydrogen atoms of a hydrocarbon are replaced with fluorine atoms. Since the per fluorocarbon has a high chemical stability in particular, and also has a high electrical resistivity, it is preferable as a refrigerant.

The insulating piping 50 is an insulating piping with flexibility. A material thereof is comprised of a nylon-based resin, a polyolefin-based resin, and the like. A flow regulating valve 30 for regulating the flow of the refrigerant 40 is provided in the insulating piping 50. In the insulating piping 50, a conductive material 52 is arranged within the piping. The conductive material 52 has a mesh structure covering the cross-section of the flow path of the insulating piping 50. The mesh-shaped conductive material 52 is grounded by a grounding wire 54 connected thereto.

FIG. 2 is a diagram showing the structure of the conductive material 52 in the semiconductor laser apparatus 1 according to the first embodiment. Here, the area (a) shown in FIG. 2 is a perspective view showing the conductive material having a mesh structure applied to the first embodiment, the area (b) corresponds to the cross-section along line I-I shown in the area (a) and is a view showing an example of having a circular-shaped wire material in cross-section of the mesh structure, and the area (c) corresponds to the cross-section along line I-I shown in the area (a) and is a view showing an example of having a rectangular-shaped wire material in cross-section of the mesh structure.

As shown in the area (a) of FIG. 2, the conductive material 52 is a circular material having a diameter capable of covering the cross-section of the flow path of the insulating piping 40, and has a structure knitted in a lattice. A variety of materials such as copper, stainless steel, and aluminum are applicable to the material of the conductive material since the refrigerant 40 consists of a fluorocarbon having non-reactivity. Also, as shown in the area (b) of FIG. 2, the cross-section in parallel to the flow or stream line of the refrigerant 40 of the conductive material 52 (corresponding to the cross-section along line I-I in the area (a)) may have a circular figure. Alternatively, as shown in the area (c) of FIG. 2, the cross-section in parallel to the flow or stream line of the refrigerant 40 of the conductive material 52 (corresponding to the cross-section along line I-I in the area (a)) may have a rectangular figure. With the above-mentioned mesh structure, the conductive material 52 has an expanded surface area coming in contact with the refrigerant, thereby enhancing an advantageous effect discharging static electricity charged in the conductive material. On the other hand, the refrigerant 40 flowing inside the insulating piping 50 leads to pass through the pattern of the mesh. It should be noted that when the form of the conductor 52 provides a structure with an enlarged contact area with the refrigerant 40 and passing freely through the refrigerant 40, it is not limited to the aforementioned mesh structure.

Figure 3:
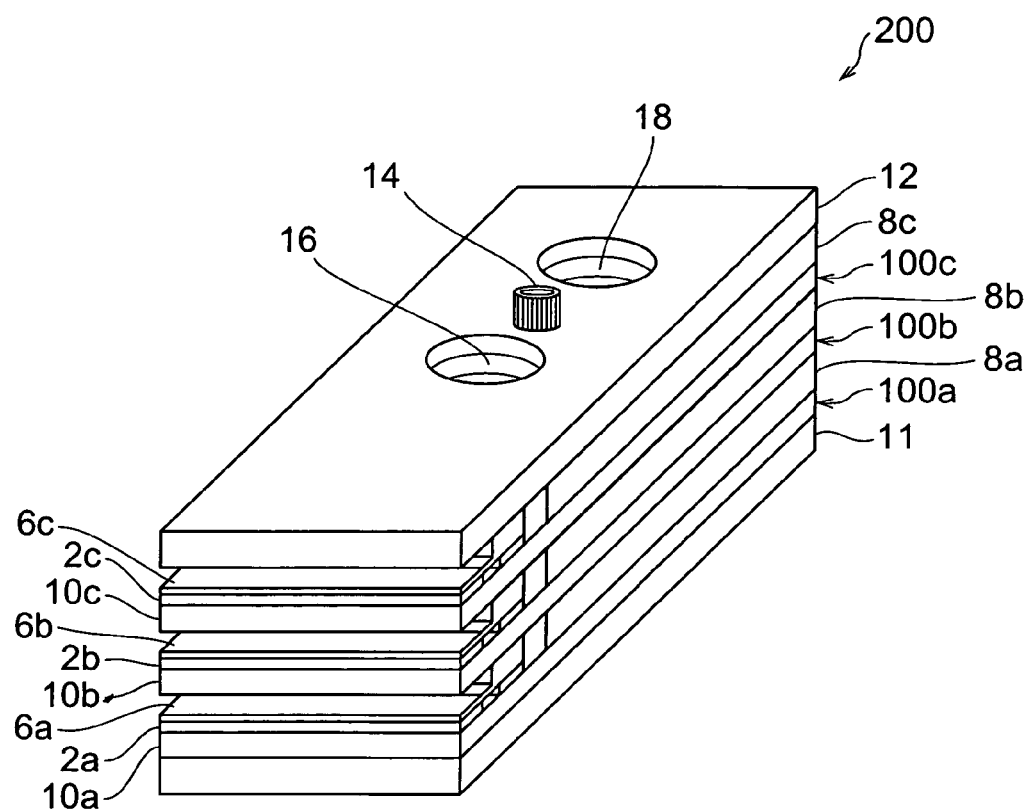
FIG. 3 is a perspective view showing a structure of a semiconductor laser stack in the semiconductor laser apparatus (FIG. 1) according to a first embodiment.

FIG. 3 is a perspective view showing the structure of a semiconductor laser stack in the semiconductor laser apparatus according to the first embodiment. A semiconductor laser stack 200 is composed of three semiconductor laser units 100a to 100c, a plus electrode 11, a minus electrode 12, a set screw 14, a supply port 16, and an exhaust port 18. The semiconductor laser units 100a to 100c each have semiconductor laser arrays 2a to 2c, n-type electrodes 6a to 6c, sealing silicone rubbers 8a to 8c, and heat sinks 10a to 10c. The semiconductor laser array 2a is arranged between the upper surface of the heat sink 10a and the lower surface of the heat sink 10b, the semiconductor laser array 2b is arranged between the upper surface of the heat sink 10b and the lower surface of the heat sink 10c, and the semiconductor laser array 2c is arranged on the upper surface of the heat sink 10c. Thus, the semiconductor laser arrays 2a to 2c and heat sinks 10a to 10c stacked alternately to be arranged are secured in a stacked state with the set screw 14.

The heat sinks 10a to 10c each are conductive, and the plus electrode 11, heat sink 10a, semiconductor laser array 2a, n-type electrode 6a, heat sink 10b, semiconductor laser array 2b, n-type electrode 6b, heat sink 10c, semiconductor laser array 2c, n-type electrode 6c, and minus electrode 12 are electrically connected with each other in sequence. When a voltage is applied between the plus electrode 11 and minus electrode 12, a laser beam is outputted from each of the semiconductor laser arrays 2a to 2c.

The semiconductor laser arrays 2a to 2c each include a plurality of semiconductor laser elements arrayed one-dimensionally, and thereby have a plurality of laser emission spots arranged in a line. In the first embodiment, the semiconductor laser arrays integrated monolithically by the plurality of semiconductor laser elements are applied. In such a semiconductor laser array, typically, an active layer or electrode is divided by a plurality of stripe waveguides. However, in the semiconductor laser apparatus according to the present invention, in place of the semiconductor laser array having the aforementioned structure, semiconductor laser arrays having a structure arranged in a line by the plurality of separate semiconductor laser chips elements are also applicable.

The supply port 16 and exhaust port 18 each are prepared in a state penetrating the semiconductor laser units 100a to 100c. The supply port 16 is communicated with each supply port of the semiconductor laser units 100a to 100c, while the exhaust port 18 is communicated with each exhaust port of the semiconductor laser units 100a to 100c. The sealing silicone rubbers 8a, 8b, 8c ensure the insulation between the heat sinks located thereon, and operates to prevent the leakage of the refrigerant. The supply port 16 and exhaust port 18 are connected with the aforementioned insulating piping 50 (see FIG. 1), to thus flow the refrigerant 40.

The heat sinks 10a to 10c each are a jet cooling-type heat sink. That is, the heat sinks 10a to 10c have a structure that spouts the refrigerant by way of small holes prepared immediately under the semiconductor laser arrays 2a to 2c, which enables to perform heat exchange efficiently based on the jet turbulent flow of the refrigerant. The heat sink may also be a microchannel-type one; in this case, when the refrigerant flows through fine refrigerant flow paths, the immediately under area of the semiconductor laser arrays can be cooled.

Next, the operation of the semiconductor laser apparatus 1 according to the first embodiment will be described below.

Figure 4:
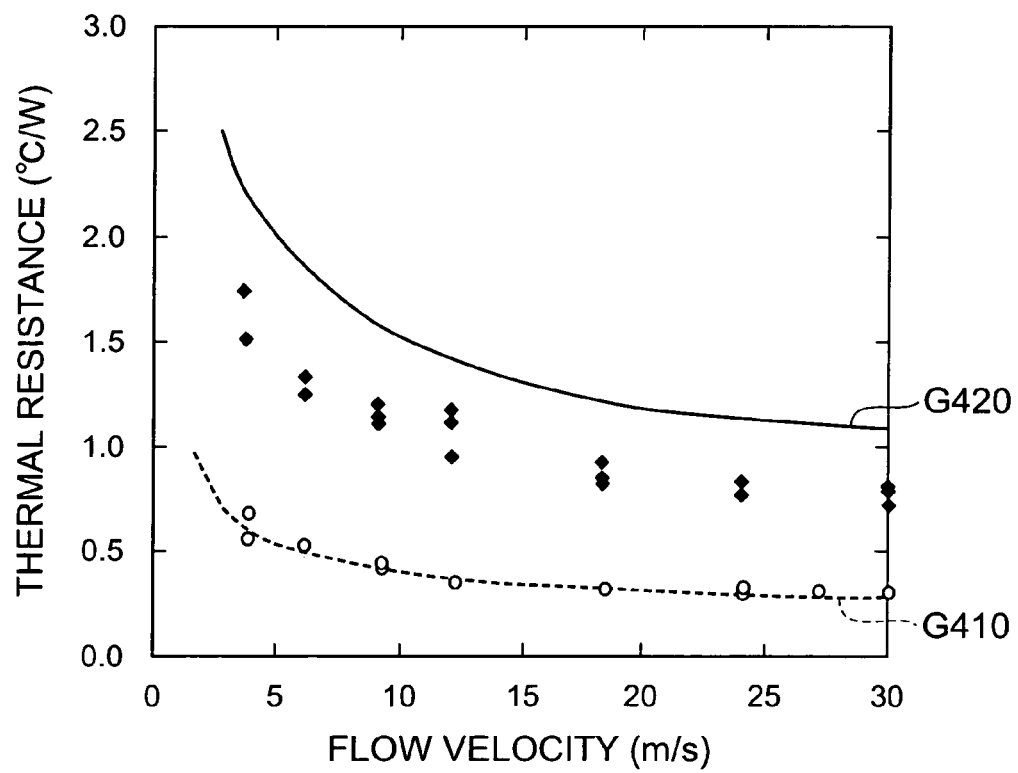
FIG. 4 is a graph showing the relationship between the flow velocity and the thermal resistance with respect to the water and fluorocarbon that flow through fine flow paths.

Fluorocarbon is applied for the refrigerant in the semiconductor laser apparatus, in place of water conventionally applied water. FIG. 4 is a graph showing the relationship between flow velocity and thermal resistance with respect to water and the fluorocarbon that flow through the fine flow paths. The abscissa represents the flow velocity, while the ordinate represents the thermal resistance. Thus, the curve G410 represents calculated value with respect to water, and symbol "○" denotes an actual value. The curve G420 represents calculated value with respect to the fluorocarbon, and symbol "◆" denotes an actual value.

It is conventionally known that the fluorocarbon is considerably inferior to water in heat transfer characteristics, to thus be not applied to the refrigerant of the semiconductor laser array. As shown in FIG. 4, the thermal resistance of fluorocarbon (curve G420) is considerably greater than that of water (curve G410) in each flow velocity region, which represents the inferiority as the refrigerant, resulting in supporting such conventional recognition.

However, the inventors et al. actually made an experiment assuming a case where the fluorocarbon and water each were applied as the refrigerants for the heat sinks of the semiconductor laser apparatus; thus, it proved that the heat transfer characteristic of the fluorocarbon was more excellent beyond expectation. The actual values shown in FIG. 4 (denoted by symbol "○" and symbol "◆") are provided by respectively flowing the fluorocarbon and water through fine flow paths each having a width of 1 mm as the refrigerant flow path of the heat sink of the semiconductor laser apparatus, and then plotting measured values of the thermal resistance to the flow velocity. As can be seen from the actual values in FIG. 4, the actual thermal resistance of fluorocarbon is considerably smaller than the calculated value. Thus, in the calculated value (curve G420), the thermal resistance of the fluorocarbon is greater by 1° C./W or more at each flow velocity as compared to that of water, while in the actual value (symbol "◆"), such a difference is approximately 0.5° C./W. However, as is apparent from FIG. 4, the calculated value (curve G410) and actual value (symbol "○") in water accord well together.

As described above, in the heat transfer characteristic of the fluorocarbon, the actual value supposed by the semiconductor laser apparatus could be more excellent than the calculated value. This reason is guessed as follows. Thus, fluorocarbon is smaller in surface tension than water. For this reason, when fluorocarbon is flown in fine or minute refrigerant flow paths such as the semiconductor laser apparatus, it can approach finer areas, so that an effect of thermal conduction can be larger than an estimated one. As a result, it is considered that the thermal resistance value may be smaller than the calculated value.

From the above, it turned out that when the fluorocarbon was applied to a refrigerant for the heat sink of the semiconductor laser apparatus, a cooling efficiency near water could be obtained. Then, the fluorocarbon is by far higher in chemical stability and lower in conductance as compared with water; thus, an advantageous effect of preventing the corrosion of the refrigerant flow path can be expected.

On the other hand, when the fluorocarbon is applied to the refrigerant, static electricity may occur easily. In the semiconductor laser apparatus, an insulating piping with flexibility is generally applied to the connection between the chiller and the semiconductor laser stack. By the application of the piping with flexibility, convenience for the piping arrangement or convenience where the semiconductor laser stack is mounted on a mobile such as robot can be schemed. Then, as compared to a flexible tube made of an expensive metal, it is characterized in that the insulating piping is much cheaper. In addition, the insulating piping has an excellent corrosion-resistant characteristic as compared to a metal piping.

However, when the fluorocarbon having an electrical resistivity of $10^{13}$ $\Omega \cdot m$, which is still higher than $10^7$ $\Omega \cdot m$ of water, flows in such a insulating piping, static electricity may occur easily as compared with a case where water is applied to the refrigerant. That is, in accordance with the friction of the flow of the fluorocarbon that is an insulating fluid, the static electricity charging within the insulating piping may increase. Meanwhile, when the voltage of the charged static electricity leads to a high voltage, a static electricity spark may occur between the neighboring substances. This spark noise can cause a malfunction of apparatus and the like. In the worst case, an electrical breakdown occurs, which can cause breakage of the piping to leak the refrigerant. Thus, in the aforementioned first embodiment, a mesh-shaped conductor is positioned inside the insulating piping in a grounded state. With this construction, discharging of the charged static electricity becomes possible.

As mentioned above, when the semiconductor laser apparatus 1 according to the first embodiment shown in FIG. 1 operates, the refrigerant 40 containing the fluorocarbon cooled by the chiller 20 is supplied into the semiconductor laser stack 200 via the insulating piping 50. The refrigerant 40 is supplied into the heat sinks 10a to 10c. The refrigerant supplied to the heat sinks 10a to 10c cools the semiconductor laser arrays 2a to 2c mounted on the heat sinks 10a to 10c. The refrigerant exhausted from the heat sinks 10a to 10c is returned to the chiller 20 via the insulating piping 50 to be cooled again, and then cools the heat sinks 10a to 10c of the semiconductor laser stack 200.

Since the refrigerant 40, comprised of the fluorocarbon flowing through the heat sinks 10a to 10c, has no possibility to corrode the refrigerant flow path, the semiconductor laser arrays 2a to 2c can be cooled stably for a long period, thereby performing improvement of the life of elements and stabilized optical outputs. The static electricity caused by a case where the refrigerant 40, which is comprised of the fluorocarbon having a lower conductivity, flows in the insulating piping 50 can be discharged from the conductive material 52 via the grounding wire 54, thereby preventing efficiently the occurrence of sparking due to static electricity and so on.

Further, it turned out that when the fluorocarbon is applied to the refrigerant, cavitations occur easily as compared to a case of water. The cavitation is a phenomenon such that in a portion occurring a lowered pressure due to the stream of a fluid, vaporization of the fluid, separation of dissolved gases, and the like may occur, thereby causing a cavity in the fluid. The occurrence of the cavitation leads to reduced contact area with an exothermic body, resulting in lowering heat exchange efficiency.

Figure 5:
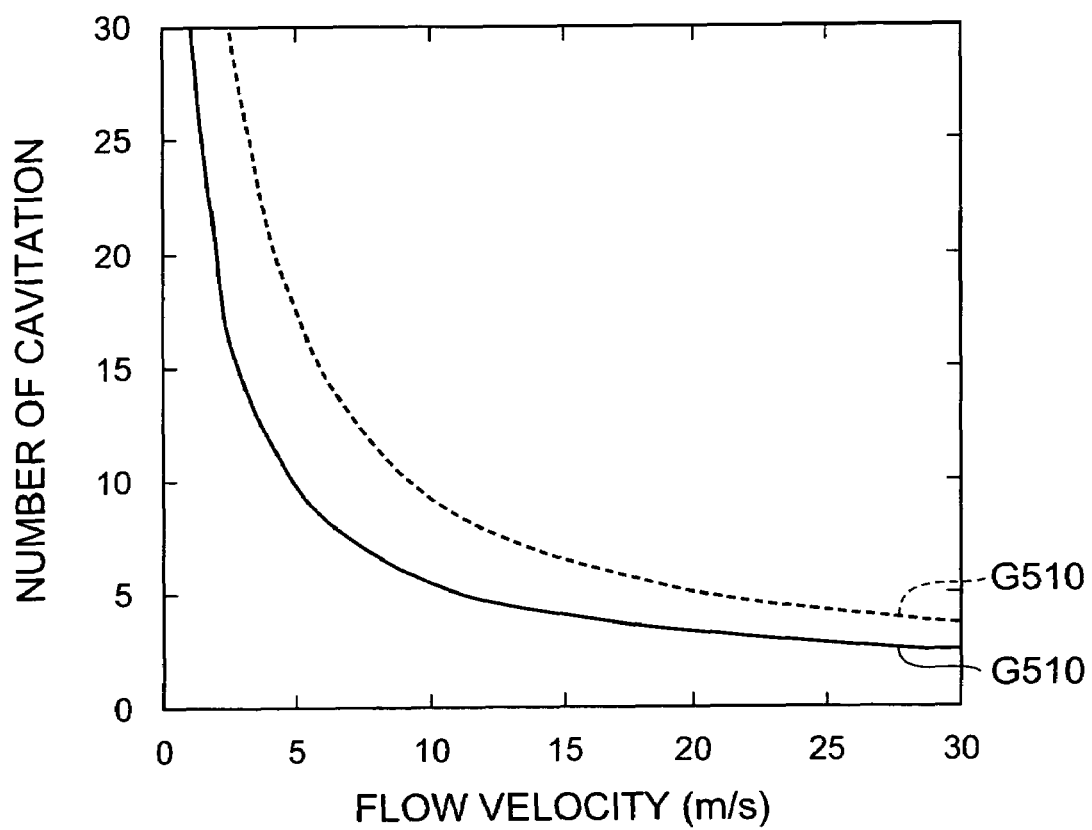
FIG. 5 is a graph showing the relationship between the flow velocity and the number of cavitations with respect to the water and fluorocarbon.

FIG. 5 is a graph showing the relationship between the flow velocity and the number of cavitations with respect to water and fluorocarbon. Note that in FIG. 5, the curve G510 shows the flow velocity and the number of cavitations with respect to water, and the curve G520 shows the relationship between the flow velocity and the number of cavitations with respect to the fluorocarbon. As can be seen from FIG. 5, the fluorocarbon (G520) has the smaller number of cavitations in each flow velocity region to occur easily as compared to water (G510). In particular, when the number of cavitations becomes 5 or less, risk of the occurrence of cavitations increases.

FIG. 6 is graphs showing together the aforementioned relationships. In FIG. 6, with respect to water, the area (a) shows the relationships between the flow velocity and the thermal resistance and between the flow velocity and the number of cavitations, and with respect to the fluorocarbon, the area (b) shows the relationships between the flow velocity and the thermal resistance and between the flow velocity and the number of cavitations. The curve G610TF shown in the area (a) corresponds to the curve G410 in FIG. 4, while the curve 610CF corresponds to the curve G510 in FIG. 5. Also, the curve G620TF shown in the area (b) corresponds to the curve G420 in FIG. 4, while the curve 620CF corresponds to the curve G520 in FIG. 5. From these curves, it turns out that with respect to the flow velocity, there is a trade-off relationship between the thermal resistance and the risk of occurrence of the cavitation. When the cavitations occur, there renders a large bad influence such as lowered heat exchange efficiency and cavitation damage (mechanical corrosion). Therefore, enhancement of the heat efficiency is required while controlling the flow velocity.

Figure 7:
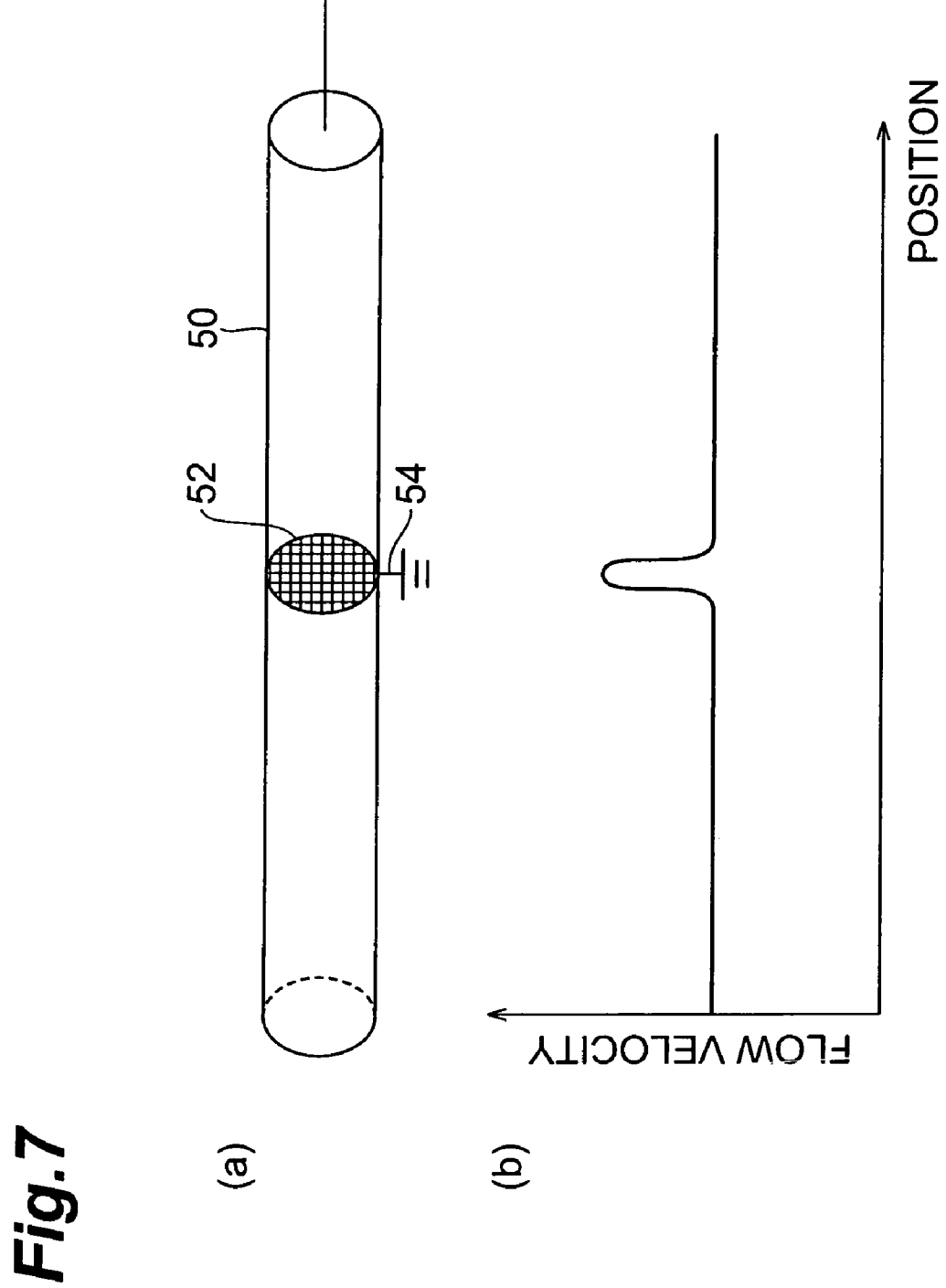
FIG. 7 is a view showing the relationship between the position of the refrigerant flowing in the insulating piping and the flow velocity in the semiconductor laser apparatus (FIG. 1) according to the first embodiment.

The risk of occurrence of the cavitation is also affected by a change of the velocity of the refrigerant. When the change of the flow velocity of the refrigerant is great, the cavitation occurs easily even if the average flow velocities of the refrigerant are the same. The flow velocity of the refrigerant has the relationship in inverse proportion with the sectional area of flow path of the refrigerant. However, in the aforementioned embodiment, since the grounded conductive material is arranged inside the insulating piping, the flow velocity of the insulating piping can vary easily. FIG. 7 is a view showing the relationship between the position of the refrigerant flowing in the insulating piping and the flow velocity in the semiconductor laser apparatus according to the first embodiment. Note that in FIG. 7, the area (a) shows part of the insulating piping arranged with the conductive material, and the area (b) shows the relationship between the corresponding position and the flow velocity of the refrigerant.

In this way, in the insulating piping 50, it turns out that the flow velocity changes rapidly at the portion provided with the conductive material 52 and the grounding wire 54. When the change of the flow velocity of the refrigerant is large, the cavitation can possibly occur easily. Even if the conductive material is arranged at a portion away from the heat sink, in a case where a nucleus of bubbles is generated at that portion, a high viscosity of the fluorocarbon retards the disappearance of the nucleus of bubbles. Then, when such a nucleus of bubbles flows in the vicinity of the heat sink, the cavitation occurs more easily. For this reason, it is required to suppress the generation of the nucleus of bubbles due to variation of the flow velocity of the refrigerant in the whole piping system.

In this case, for example, when the flow velocity of the whole refrigerant is controlled by adjusting the feed pressure of the refrigerant of the chiller, the heat resistance is made larger, which can lower the cooling efficiency. Therefore, with respect to the arranged portion of the conductive material, it is requested to suppress locally high speed development of the flow velocity of the refrigerant.

Figure 8:
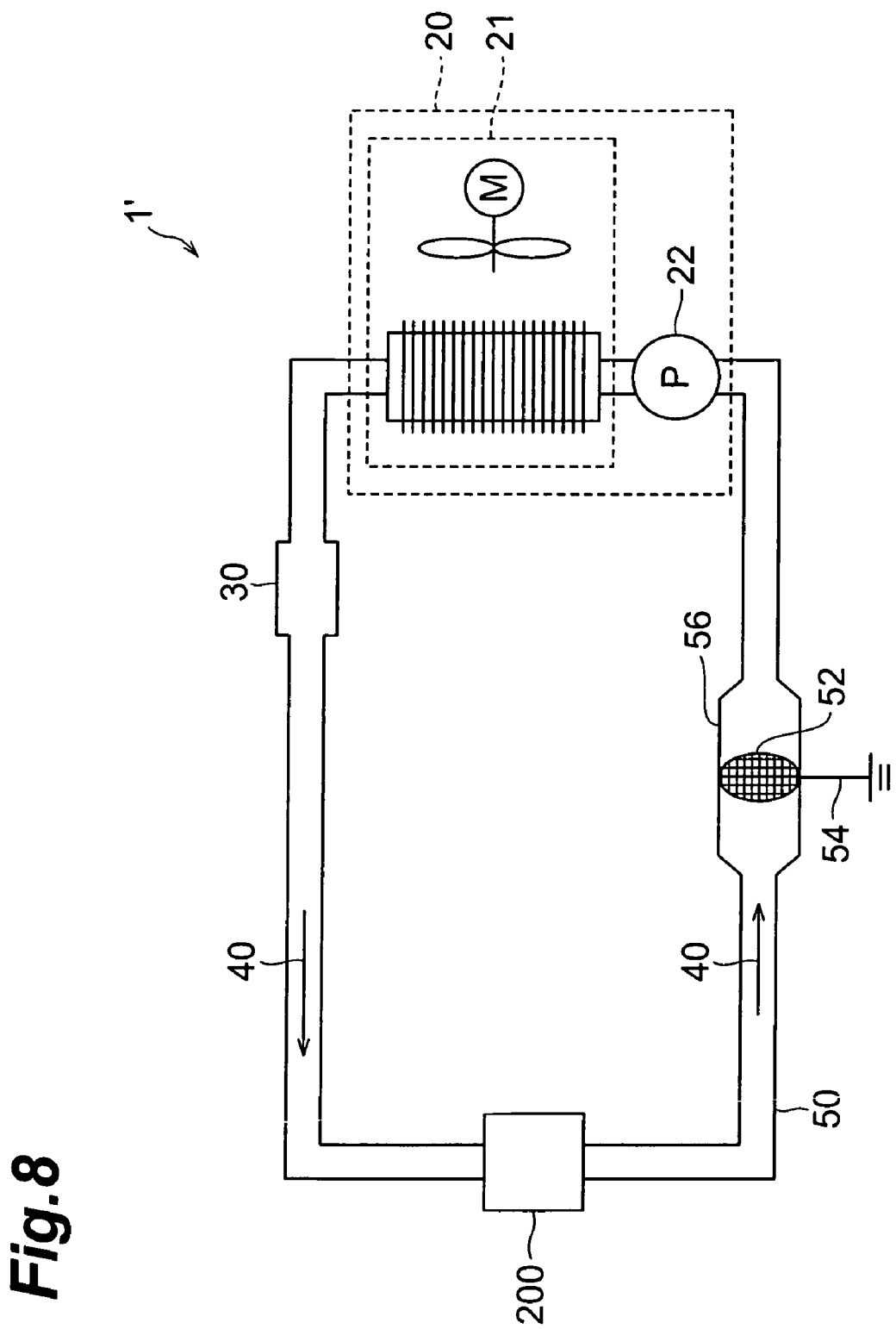
FIG. 8 is a diagram showing a construction of a second embodiment of the semiconductor laser apparatus according to the present invention.

FIG. 8 is a view showing the construction of a second embodiment of the semiconductor laser apparatus according to the present invention. A semiconductor laser apparatus 1' according to the second embodiment is different from that of the aforementioned first embodiment in that an insulating piping 50 includes an expanded diameter portion 56 of which the inner diameter is locally expanded, and that a conductive material 52 is arranged at the expanded diameter portion 56.

Figure 9:
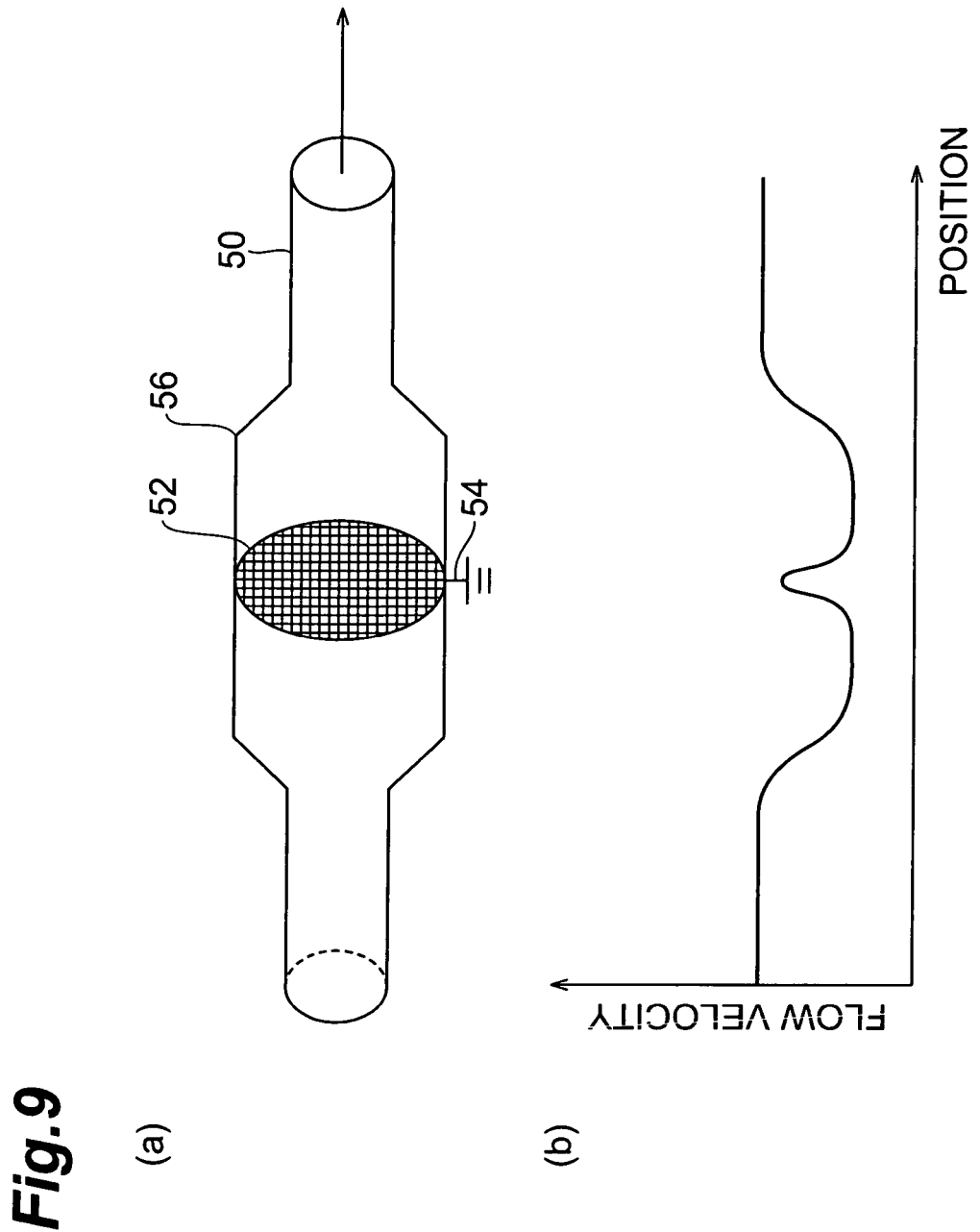
FIG. 9 is a view showing the relationship between the position of the refrigerant flowing in the insulating piping and the flow velocity in the semiconductor laser apparatus (FIG. 8) according to the second embodiment.

FIG. 9 is a view showing the relationship between the position of the refrigerant flowing within the insulating piping and the flow velocity in the semiconductor laser apparatus according to the second embodiment. Note that in FIG. 9, the area (a) shows the vicinity of the expanded diameter portion 56, and the area (b) shows the relationship between the corresponding position and the flow velocity of the refrigerant.

As shown in FIG. 9, the flow velocity of the refrigerant flowing in the insulating piping 50 decreases gradually when the refrigerant enters the expanded diameter portion 56. Then, when the refrigerant enters the area that is provided with the conductive material 52 and grounding wire 54, the flow velocity thereof increases. However, since the flow velocity is reduced at the expanded diameter portion 56, an increase of the flow velocity is small at the area provided with the conductive material 52. Then, when the refrigerant passes through the conductive material 52, the flow velocity also decreases. Then, when the refrigerant is exhausted from the expanded diameter portion 56, the flow velocity gradually increases, and soon returns to the flow velocity before entering the expanded diameter 56. In this way, since the expanded diameter portion 56 is provided, the change of the flow velocity of the refrigerant is suppressed, thereby preventing the occurrence of the cavitation. Further, only a portion of the piping is enlarged in diameter, as stated above, it is not necessitated to enlarge the diameter of the whole piping; as compared to water, the amount of the fluorocarbon is reduced, which enables a design at low cost. Furthermore, at the expanded diameter portion 56, when the sectional area of the area that is arranged with the conductive material inside the insulating piping (refrigerant passing sectional area) is equal to that of the area not arranged with the conductive material, variation of the flow velocity can be reduced still more.

Incidentally, when the refrigerant passes through the mesh-shaped conductive material in a sectional form shown in the areas (b) and (c) of FIG. 2, in the following flow, a vortex or micro-bubble nucleus can be generated easily. In that event, there is a possibility to increase the generation risk of the cavitation at the heat sink unit.

Figure 10:
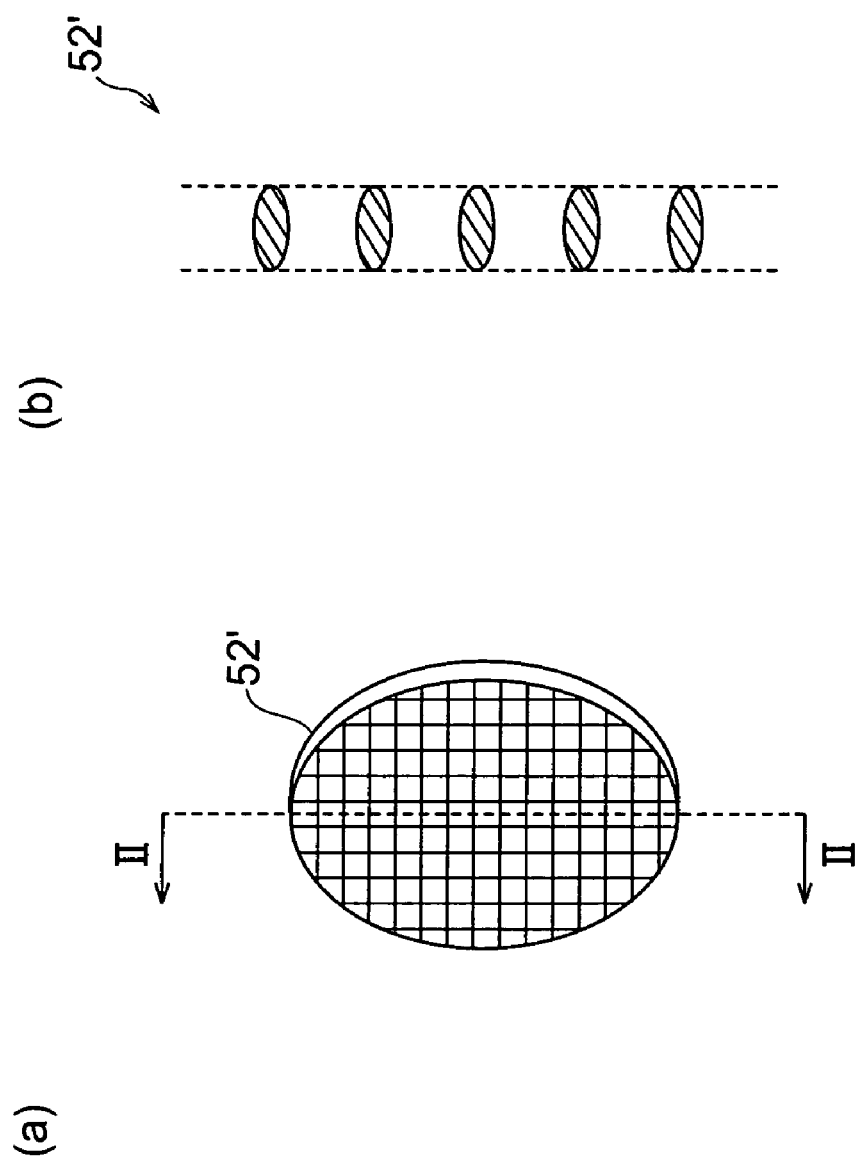
FIG. 10 is a view showing a structure of a conductive material to be applied in a third embodiment according to the present invention.

For this reason, it is preferable that the structure of the conductive material arranged inside the insulating piping is provided with that shown in FIG. 10. Note that FIG. 10 is a view showing the structure of the conductive material applied to a third embodiment of the semiconductor laser apparatus according to the present invention. The semiconductor laser apparatus according to the third embodiment may comprise any one of the aforementioned first and second embodiments except the construction of the conductive material.

The area (a) shown in FIG. 10 is a perspective view showing the structure of a mesh-shaped conductive material applied to the third embodiment, and the area (b) corresponds to the cross-section taken along line I-I in the area (a) and is a view showing an example in which the cross-section of a wire material in the mesh structure has a streamline shape. As shown in the area (a) of FIG. 10, a conductive material 52' has a mesh structure. However, as shown in the area (b), the cross-section in parallel to the stream line of an insulating piping 50 of a conductive material 52' (corresponding to the cross-section taken along line I-II depicted in the area (a)) has a streamline shape. In this way, the occurrence of the vortex in the following flow of the conductive material 52' can be avoided. In addition, since the resistance of the conductive material 52' is suppressed small, the change of the flow velocity passing through the conductive material 52' becomes small, thereby preventing the occurrence of the cavitation.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The semiconductor laser apparatus according to the present invention can obtain a high output of several to one hundred watts to be applicable to a light source such as laser trimmer, laser soldering iron, and laser marker.

The invention claimed is:

1. A semiconductor laser apparatus, comprising:
   a semiconductor laser array;
   a heat sink on which said semiconductor laser array is mounted;
   a refrigerant including fluorocarbon and flowing inside said heat sink;
   a refrigerant supplier for supplying the refrigerant to said heat sink;
   an insulating piping connected between said heat sink and said refrigerant supplier, and flowing the refrigerant inside said piping; and
   a conductive material arranged in said insulating piping in a grounded state.

2. A semiconductor laser apparatus according to claim 1, wherein said conductive material has a mesh structure covering a cross-section of a flow path within said insulating piping.

3. A semiconductor laser apparatus according to claim 1, wherein a cross-section of said conductive material in parallel to the streamline of a refrigerant includes a portion with a streamline shape.

4. A semiconductor laser apparatus according to claim 1, wherein said insulating piping includes an expanded diameter portion having a locally expanded inner diameter, and said conductive material is arranged at said expanded diameter portion.

5. A semiconductor laser apparatus according to claim 1, wherein said semiconductor laser array has a plate shape, and said heat sink also has a plate shape, and a semiconductor laser unit is constructed by said semiconductor laser array and said heat sink.

6. A semiconductor laser apparatus, comprising:
   a plurality of semiconductor laser units each having the same structure as that in a semiconductor laser apparatus according to claim 5,
   wherein said plurality of semiconductor laser units are stacked such that said semiconductor laser units and heat sinks are alternately arranged to each other.

* * * * *